United States Patent
Nozieres et al.

(10) Patent No.: US 7,411,817 B2
(45) Date of Patent: Aug. 12, 2008

(54) MAGNETIC MEMORY WITH A MAGNETIC TUNNEL JUNCTION WRITTEN IN A THERMALLY ASSISTED MANNER, AND METHOD FOR WRITING THE SAME

(75) Inventors: Jean-Pierre Nozieres, Corenc (FR); Bernard Dieny, Lans en Vercors (FR); Olivier Redon, Seyssinet-Pariset (FR); Ricardo Sousa, Grenoble (FR); Ioan-Lucian Prejbeanu, Meylan (FR)

(73) Assignees: Centre National de la Recherche Scientifique, Paris (FR); Commissariat a l'Energie Atomique, Paris (FR)

( * ) Notice: Subject to any disclaimer, the term of this patent is extended or adjusted under 35 U.S.C. 154(b) by 73 days.

(21) Appl. No.: 11/483,425

(22) Filed: Jul. 7, 2006

(65) Prior Publication Data
US 2006/0291276 A1    Dec. 28, 2006

Related U.S. Application Data

(63) Continuation of application No. PCT/FR2005/050103, filed on Feb. 17, 2005.

(30) Foreign Application Priority Data
Feb. 23, 2004    (FR)  .................... 04 01762

(51) Int. Cl.
*G11C 11/00*    (2006.01)
(52) U.S. Cl. .................... 365/158; 365/171; 365/173
(58) Field of Classification Search .................. 365/158, 365/171, 173
See application file for complete search history.

(56) References Cited

U.S. PATENT DOCUMENTS 4,949,039 A    8/1990    Grunberg (Continued)

FOREIGN PATENT DOCUMENTS

FR    2 829 867 A1    3/2003

(Continued)

OTHER PUBLICATIONS

Zheng, Y.K., et al., "*Multistate Per-cell Magnetoresistive Random-Access Memory Written at Curie Point*," IEEE Transactions on Magnetics, IEEE Inc., New York, US, vol. 38, No. 5 (Sep. 2002), pp. 2850-2852.

(Continued)

*Primary Examiner*—Richard T. Elms
*Assistant Examiner*—Nam T Nguyen
(74) *Attorney, Agent, or Firm*—Burr & Brown

(57) ABSTRACT

A system and method for writing to a magnetic memory written in a thermally assisted manner, each memory point formed by a magnetic tunnel junction, and having a substantially circular cross-section of the memory which is parallel to the plane of the layers forming the tunnel junction. The tunnel junction includes at least a trapped layer with a fixed magnetisation direction, a free layer with a variable magnetisation direction with an insulating layer arranged there between. The free layer is formed from at least one soft magnetic layer and a trapped layer, with the two layers being magnetically coupled by contact. During read operations and at rest, the operating temperature of the memory is lower than the blocking temperature of the free and trapped layers, respectively.

16 Claims, 5 Drawing Sheets

U.S. PATENT DOCUMENTS

| | | | |
|---|---|---|---|
| 5,159,513 A | 10/1992 | Dieny et al. | |
| 5,343,422 A | 8/1994 | Kung et al. | |
| 5,583,725 A | 12/1996 | Coffey et al. | |
| 5,640,343 A | 6/1997 | Gallagher et al. | |
| 5,959,880 A | 9/1999 | Shi et al. | |
| 5,966,323 A | 10/1999 | Chen et al. | |
| 6,021,065 A | 2/2000 | Daughton et al. | |
| 6,385,082 B1 | 5/2002 | Abraham et al. | |
| 6,654,278 B1 | 11/2003 | Engel et al. | |
| 6,960,815 B2 * | 11/2005 | Yoda et al. | 257/421 |
| 7,006,375 B2 * | 2/2006 | Covington | 365/173 |
| 2003/0117839 A1 | 6/2003 | Ooishi | |
| 2003/0123282 A1 | 7/2003 | Nickel et al. | |
| 2003/0206434 A1 | 11/2003 | Leuschner | |
| 2005/0002228 A1 | 1/2005 | Dieny et al. | |
| 2005/0040433 A1 | 2/2005 | Nozieres et al. | |
| 2005/0047206 A1 | 3/2005 | Nozieres et al. | |
| 2006/0056114 A1 * | 3/2006 | Fukumoto et al. | 360/324.2 |

FOREIGN PATENT DOCUMENTS

| | | |
|---|---|---|
| FR | 2 829 868 A1 | 3/2003 |
| FR | 2 832 542 A1 | 5/2003 |
| JP | 2003-060173 A1 | 2/2003 |
| WO | WO 00/79540 A1 | 12/2000 |
| WO | WO 03/077257 A1 | 9/2003 |

OTHER PUBLICATIONS

Wang, J., et al., "*Low-Current Blocking Temperature Writing of Double Barrier Magnetic Random Access Memory Cells,*" Applied Physics Letters, American Institute of Physics, New York, US, vol. 84, No. 6 (Feb. 9, 2004), pp. 945-947.

Saito, Y., et al., "*Bias Voltage and Annealing-Temperature Dependences of Magnetoresistance Ratio in Ir-Mn Exchange-Biased Double Tunnel Junctions,*" Journal of Magnetism and Magnetic Materials, vol. 223, Issue 3, Feb. 2001, pp. 293-298. Abstract only.

Daughton, J.M., et al., "*Magnetic Tunneling Applied to Memory (Invited),*" Journal of Applied Physics, Apr. 15, 1997, vol. 81, Issue 8, pp. 3758-3763 Abstract only.

* cited by examiner

Ellipse

Crescent

Semi-ellipse

Diamond

MAGNETIC MEMORY WITH A MAGNETIC TUNNEL JUNCTION WRITTEN IN A THERMALLY ASSISTED MANNER, AND METHOD FOR WRITING THE SAME

TECHNICAL FIELD

The present invention relates to the field of magnetic memories, and in particular to non-volatile random access magnetic memories that allow data to be stored and read in electronic systems. More specifically, it concerns random access magnetic memories, known as M-RAM, comprised of a magnetic tunnel junction.

The invention also concerns a thermomagnetic method for writing in such a memory.

PRIOR ART

M-RAM magnetic memories have aroused renewed interest with the development of magnetic tunnel junctions (MTJ) having a high magnetoresistance at ambient temperature. These random-access magnetic memories offer numerous advantages:

speed (writing and reading take only a few nanoseconds);
non-volatility;
lack of fatigue during reading and writing;
insensitivity to ionizing radiation.

As such, they are likely to replace memories using more conventional technology, based on the charge state of a capacity (DRAM, SRAM, FLASH) and thus to become a universal memory.

In the first magnetic memories that were manufactured, the memory point consisted of an element with "giant magnetoresistance", comprised of a stack of several alternatively magnetic and non-magnetic metallic layers. A detailed description of this type of structure can be found, for example, in the documents U.S. Pat. No. 4,949,039 and U.S. Pat. No. 5,159,513 for the basic structure, and in the document U.S. Pat. No. 5,343,422 for the production of a RAM memory from these basic structures.

By virtue of its architecture, this technology allows non-volatile memories to be made with a simple technology, but having limited capacity. The fact that the memory elements are connected in series along each line limits the possibility of integration since the signal grows increasingly weak when the number of elements increases.

The development of magnetic tunnel junction (MTJ) memory points has allowed the performances and the mode of operation of these memories to be significantly increased. These magnetic memories with a magnetic tunnel junction have been described, for example, in the document U.S. Pat. No. 5,640,343. In their simplest forms they are comprised of two magnetic layers of different coercitivity, separated by a thin insulating layer.

These magnetic tunnel junction MRAMs have undergone improvements, for example, as described in the document U.S. Pat. No. 6,021,065 and in the publication "*Journal of Applied Physics*"—Vol. 81, 1997, page 3758 and shown in FIG. 1. As can be observed, each memory element (10) is comprised of the combination of a CMOS transistor (12) and an MTJ tunnel junction (11). Said tunnel junction (11) comprises at least one magnetic layer (20) called a "storage layer", a thin insulating layer (21) and a magnetic layer (22) called a "reference layer".

It is preferred, but not in any limiting manner, to make the two magnetic layers from 3d metals (Fe, Co, Ni) and alloys thereof, and the insulating layer is conventionally made of alumina ($Al_2O_3$). The magnetic layer (22) is preferably coupled to an anti-ferromagnetic layer (23) the function of which is to trap the layer (22) so that its magnetization does not switch, or switch reversibly under the effect of an external magnetic field. Preferably the reference layer (22) may itself be comprised of several layers, as described, for example, in the document U.S. Pat. No. 5,583,725 in order to form a synthetic anti-ferromagnetic layer.

It is also possible to replace the single tunnel junction with a double tunnel junction, as described in the publication Y. Saito et al., *Journal of Magnetism and Magnetic Materials* vol. 223 (2001) page 293. In this case the storage layer is sandwiched between two thin insulating layers, with two reference layers located on the opposite side of said insulating layers.

When the magnetizations of the storage and reference magnetic layers are anti-parallel, the resistance of the junction is high. In contrast, when the magnetizations are parallel, this resistance becomes weak. The relative variation of resistance between these two states can typically attain 40% by an appropriate choice of materials which constitute the layers of the stack and/or by heat treatment of these materials. As has already been specified, the junction (11) is placed between a switching transistor (12) and a power supply line (14) (word line) forming an upper electricity conductive line. An electric current passing through the latter produces a first magnetic field. A lower electricity conductive line (15) (bit line), generally disposed orthogonally to the line (14) (word line) allows a second magnetic field to be produced when a current is passed through said line.

In writing mode the transistor (12) is blocked, and no current therefore passes through the transistor. Current pulses are passed through the power supply line (14) and through line (15). The junction (11) is therefore subjected to two orthogonal magnetic fields. One is applied according to the difficult magnetization axis of the storage layer, which is also termed "free layer" (22), in order to reduce its reversal field, while the other is applied according to its easy magnetization axis in order to cause a reversal of magnetization and therefore writing in the -memory point.

In reading mode the transistor (12) is placed in saturated mode, that is, the electric current passing through this transistor is maximum, by sending a positive current pulse into the gate electrode of said transistor. The electric current sent to the line (14) passes only through the memory point, whose transistor is placed in saturated mode. This electric current allows the resistance of the junction of this memory point to be measured. By comparison with a reference memory point, it is then known whether the magnetization of the storage layer (22) is parallel or anti-parallel to that of the reference layer (20). The state of the memory point in question ("0" or "1") can thus be determined.

As will have been -understood, the magnetic field pulses generated by the two lines (14, 15) allow the magnetization of the storage layer (20) to be switched during the writing process. These magnetic field pulses are produced by sending short current pulses (typically 2 to 5 nanoseconds) of low intensity (typically lower than 10 milliamperes) along the current lines (14, 15). The intensity of these pulses and their synchronization are adjusted so that only the magnetization of the memory point located at the intersection of these two current lines (selected point) can switch under the effect of the magnetic field generated by the two conductors. The other memory points, situated on the same line or the same column (semi-selected points) are in fact subject only to the magnetic field of only one of the conductors (14,15) and consequently are not reversed.

In order to ensure that this architecture functions satisfactorily during the writing process, it is necessary to use memory points with an anisotropic form, generally ellipses, crescents, semi-ellipses, diamonds, etc. with high length-to-width ratios, typically 1.5 and more (see FIG. 2). This geometry is required to obtain:

first, bi-stable functioning, that is, two well-defined states of the memory point corresponding to state "1" and to state "0";

second, good writing selectivity between the selected memory points and the semi-selected memory points located on the same line or the same column;

good thermal and temporal stability.

The limits of this architecture can be clearly understood from the structural mechanism of these memory points.

Since writing is formed by an external magnetic field, it is subject to the value of the individual reversal field of each memory point. If the distribution function of the reversal fields for all the memory points is wide (it is not uniform owing to manufacturing constraints and intrinsic statistical fluctuations), it is necessary that the magnetic field at the selected memory point be greater than the highest reversal field of distribution, at the risk of accidentally reversing certain memory points situated on the corresponding line or column, the reversal field of which, located in the lower part of distribution, is weaker than the magnetic field generated by the line or the column alone. Conversely, if one wishes to ensure that no memory point be written by a line or a column, the writing current must be limited in such a manner as to never exceed, for these memory points, the magnetic field corresponding to the lower part of distribution, at the risk of not writing the selected memory point at the intersection of said line and said column if its reversal field is located in the upper part of distribution.

In other words, this selection architecture by a magnetic field using lines and columns or conductors can easily lead to addressing errors when writing. In view of the fact that it is expected that the distribution function of the reversal fields of the memory points will grow wider as their dimension decreases, since it is the geometry of the memory points (form, irregularity, defect) that dominates the magnetization reversal mechanism, this effect can only worsen in future product generations.

According to an improvement described in the document U.S. Pat. No. 5,959,880, the aspect ratio of the memory point can be reduced by using the intrinsic anisotropy of the material that forms the storage layer (known to the person skilled in the art by the term magnetocrystalline anisotropy) to define the two stable states of the system. With this approach, however, the temporal or thermal stability of the system is no longer guaranteed because it is the same physical parameter that governs the writing process and thermal stability:

if magnetocrystalline anisotropy is high, the system is stable (in time and in temperature) and both states of the memory point are well defined. On the other hand, the magnetic field required to reverse the magnetization of said memory point from one stable state to another (the writing field) is significant, and therefore the power consumed during the writing process is great.

Conversely, if magnetocrystalline anisotropy is low, the power consumed when writing is low, but thermal and temporal stability is no longer assured. Furthermore the two rest states of the memory point are ill-defined because the magnetic structures within the memory point are complex and multiple depending on the cycle in the field.

In other words, it is impossible to simultaneously ensure low power consumption and thermal and temporal stability.

According to an improvement described in, for example, the patent U.S. Pat. No. 6,385,082, a current pulse is sent through the memory point during the writing process by opening the transistor (12), the purpose being to induce significant heating of said memory point. Heating of the memory point produces a lowering of the magnetic field required for writing. During this phase in which the temperature of the addressed point is significantly higher than that of the other memory points, current pulses are sent to the lines (14, 15) to create two orthogonal magnetic fields, allowing the magnetization of the storage layer of the junction in question to be switched. This writing, which is thermally assisted, enables writing selection to be improved since only the selected memory point is heated; the other semi-selected memory points on the same line or the same column remain at ambient temperature. In other words, the improvement described in this document aims at increasing writing selectivity by heating the addressed junction while retaining the basic concept of writing by sending two pulses of orthogonal magnetic fields.

Other addressing methods, also based on raising the temperature of the memory point but utilizing a single magnetic field or magnetic switching by injecting spin polarized current into the storage layer have been described in the documents FR 2 829 867 and FR 2 829 868.

The implementation of such heating of the selected memory point affords various advantages, among which mention can be made of:

a substantial improvement in writing selectivity, since only the memory point to be written is heated;

a substantial improvement in writing selectivity by utilizing materials with a strong writing field at ambient temperature;

an improvement of stability in a zero magnetic field (retention) by utilizing materials with a high magnetic anisotropy (intrinsic or due to the form of the memory point) at ambient temperature;

the possibility of greatly reducing the size of the memory point without affecting the stability limit, by utilizing materials with a high magnetic anisotropy at ambient temperature.

BRIEF DESCRIPTION OF THE INVENTION

The object of the present invention is to further optimize the advantages mentioned above by lowering the magnetization reversal field of the memory point by selecting a particular geometry of said memory point, and in particular by implementing a circular geometry. It has in fact been demonstrated—and this is the heart of the present invention—that in the context of such a circular geometry of the memory point, the anisotropy of the form of the memory point which is responsible for an increase in the magnetization reversal field is zero. As a consequence, the electric power required to effect the writing of a memory point may be lowered considerably in the thermally assisted writing approach. This result is a decisive advantage, in particular for portable applications and applications in SOI technology (silicon on insulator).

In this respect it is appropriate to emphasize that simply using a circular geometry, as described in the above-mentioned document U.S. Pat. No. 5,959,880, without using either the thermally assisted writing approach or optimization as described in the present invention, does not allow the desired functionality to be provided since it is then impossible, for the reason described above, to ensure simultaneously a low power consumption and thermal and temporal stability.

Thus the invention concerns a magnetic memory with thermally assisted writing, each memory point of which is comprised of a magnetic tunnel junction, and the cross-section of which parallel to the plane of the layers forming the tunnel junction is circular or substantially circular, said tunnel junction comprising at least:
- a reference magnetic layer, termed a "trapped layer", the magnetization of which is in a fixed direction;
- a storage magnetic layer, termed a "free layer", the direction of magnetization of which is variable;
- an insulating layer, placed between the free layer and the trapped layer, and in which the storage layer is formed of at least one soft magnetic layer, that is, having reduced magnetic anisotropy, preferably lower than 10 Oersted and typically in a range between 1 and 3 Oersted, and a trapping layer, the two layers being magnetically coupled by contact, and in which the operating temperature of the memory when reading or at rest is selected at below the blocking temperature of the free and trapped layers respectively, that is, the temperature at which magnetic trapping disappears.

According to one advantageous aspect of the invention, the soft magnetic layer of the storage layer is formed by a nickel-, cobalt- and iron-based alloy and the trapping layer is formed by an iron- and cobalt-based alloy, or by a manganese-based anti-ferromagnetic alloy, or by amorphous rare earth- and transition metal-based alloys.

Still according to the invention, the reference layer or trapped layer is preferably formed by an artificial anti-ferromagnetic synthetic layer comprised of two ferromagnetic layers of nickel-, cobalt- and iron-based alloys, separated by a non-magnetic layer, in such a manner that the magnetizations of the two ferromagnetic layers are anti-parallel.

As is known to the person skilled in the art, the storage and reference layers may in addition comprise, near the interface with the tunnel barrier, an additional layer of cobalt or cobalt-rich alloy intended to increase the polarization of the tunnel electrons and therefore the magnetoresistance amplitude.

According to the invention, the memory points are organized as a network, each memory point being connected at its peak to a conductive line and at its base to a selection transistor, with writing being carried out at the level of a memory point in question by simultaneously sending electric current pulses to said conductor and a heating current by opening said transistor.

According to an advantageous feature of the invention, the control transistor and its corresponding control line are placed beneath the memory point in question.

The manner in which the invention can be carried out and the resultant advantages will become clearer from the following embodiments, which are provided by way of information and have no limiting effect, in support of the attached figures.

BRIEF DESCRIPTION OF THE FIGURES

FIG. 4A is a schematic diagram of a memory point in accordance with a first embodiment of the invention, of which

FIG. 5A is a schematic diagram of a memory point according to a variant of the invention, of which

FIG. 6A is a schematic diagram of another variant of a memory point in accordance with the present invention, of which

DETAILED DESCRIPTION OF THE INVENTION

Figure 1:
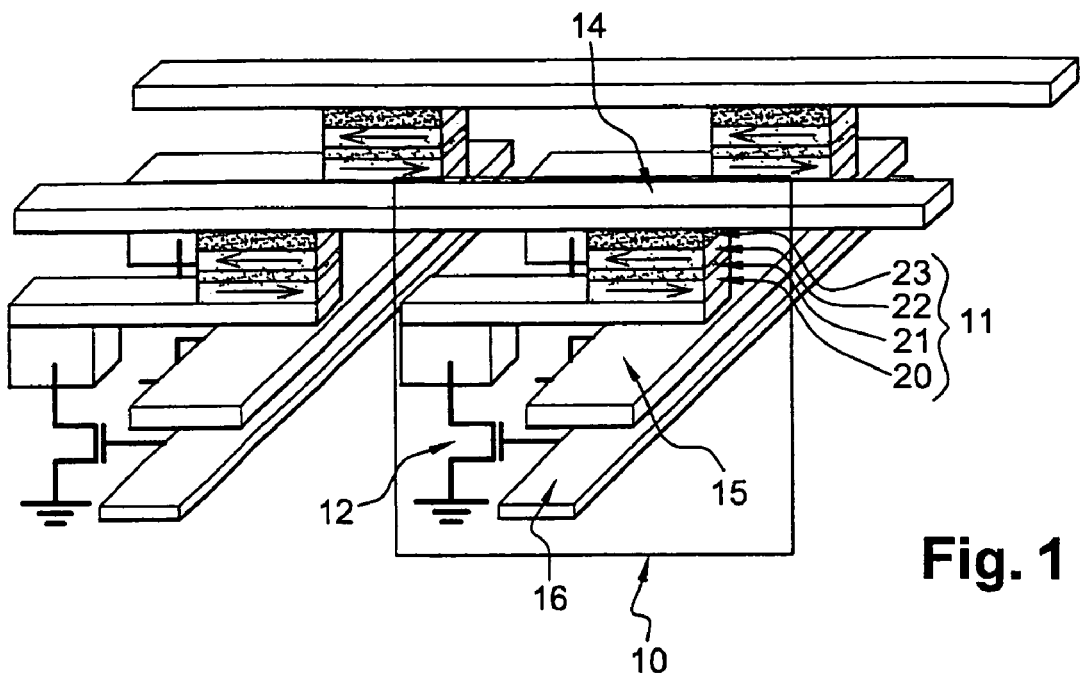
FIG. 1, which has already been described, is a schematic representation of the architecture of a prior-art magnetic memory, the memory points of which are formed by a magnetic tunnel junction.
Figure 2:
FIG. 2, which has also already been described, is a schematic diagram of the forms of prior-art memory points.
Figure 2:
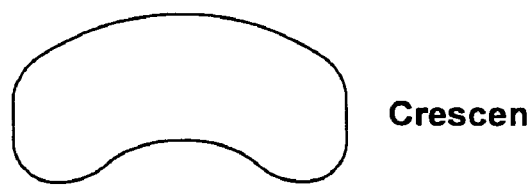
Figure 2:
Figure 2:
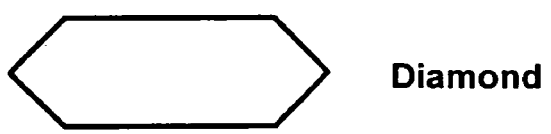
Figure 3:
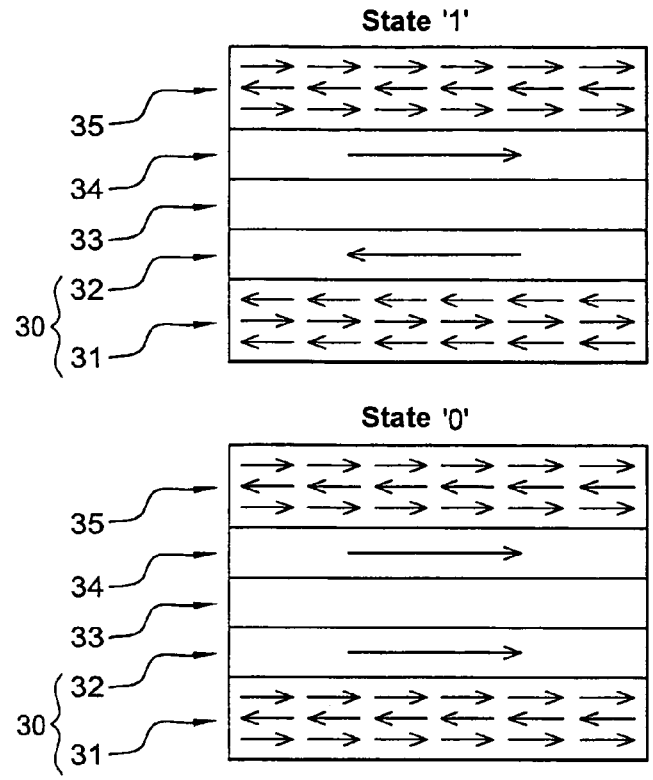
FIG. 3 is a schematic diagram illustrating the state of magnetization of the layers that form the memory points, in state "1" and state "0" respectively.

FIG. 3 shows the magnetization orientations of the different layers that form a memory point, in particular in the prior art. According to the latter, the storage layer (30) consists of a stack comprising at least one ferromagnetic layer (32) and an anti-ferromagnetic layer (31). These two layers are deposited in such a manner that a magnetic exchange coupling is established between the two layers. The stack of the complete memory point also comprises at least one insulating layer (33) and a reference layer (34), advantageously combined with a trapping layer (35). This architecture is described by the term trapped storage layer. Multiple advantages are afforded by this architecture:
- the stability limit of the memory points is extended;
- insensitivity to external magnetic fields;
- possibility of effecting multi-level storages.

According to the invention, the memory point utilizing a trapped storage layer no longer has an elongated but a circular form and more specifically, its cross-section parallel to the plane of the layers of which it is formed is circular. In other words, the memory point has a cylindrical or conical profile, and is therefore rotationally symmetrical.

According to the invention, the memory point can also be of non-circular geometry provided that its aspect ratio remains lower than 1.2 (20% difference between length and width).

Figure 7:
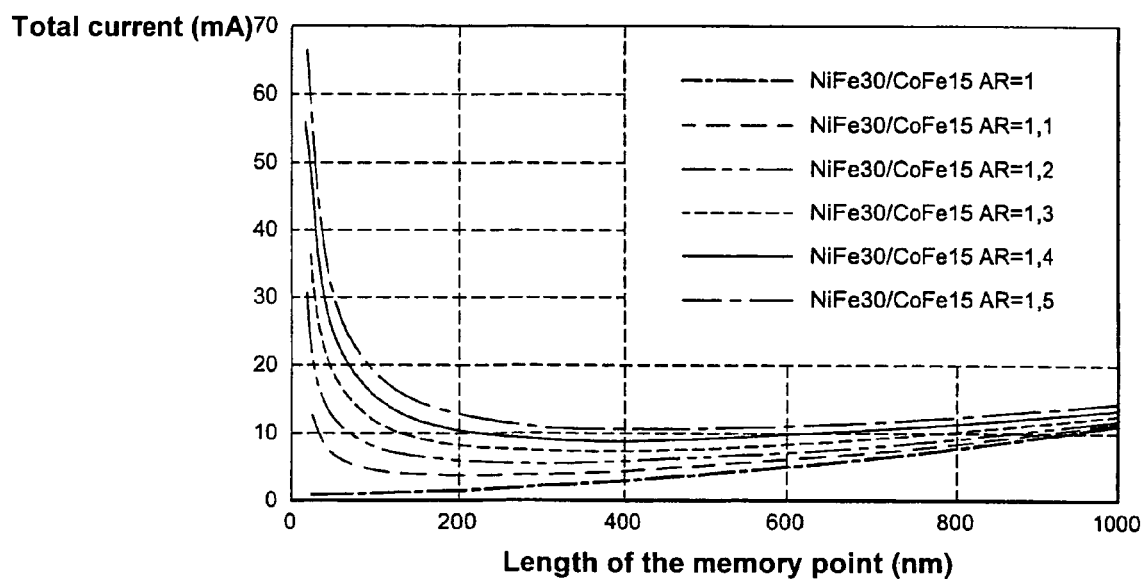
FIG. 7 describes the calculated variation of the writing field required in an elliptical $Ni_{80}Fe_{20}/Co_{90}Fe_{10}$-based memory point (respective thicknesses 30 and 15 Angstrom) as a function of the length of the memory point for different form factors AR=length/width.

As such, and as already stated above, the form anisotropy of the memory point is minimized, significantly reducing the magnetization reversal field of the memory point in the writing process, and consequently reducing the electric power required. An example of the dependence of the writing field on the different form factors is given in FIG. 7. It can be observed in this figure that when the memory point does not have a circular geometry, the writing field (expressed here as current in the conductors used to generate the magnetic field), increases greatly when the dimension of the memory point is reduced to below 200 nm, and more and more abruptly as the aspect ratio (quotient of length divided by width) increases. On the contrary, when the memory point has a circular geometry (aspect ratio=1), the writing field decreases monotonously with the dimension of the memory point, even below 200 nm.

It is advantageous for the storage layer (30) or free layer to be formed of a soft material, that is, the reversal field of which (coercive field) is very weak. This material is preferably an alloy containing nickel, iron or cobalt, in particular permalloy $Ni_{80}Fe_{20}$, NiFeCo or FeCoB. Use of a very soft material makes it possible to reduce the magnetic field required for writing, and therefore power consumption.

The trapping layers (31) and (35) are advantageously formed by an anti-ferromagnetic material and in particular by a manganese-based alloy of the type $Pt_{50}Mn_{50}$, $Ir_{20}Mn_{80}$ or $Ni_{50}Mn_{50}$. It is important to specify that the thicknesses, the chemical nature or the microstructure of the trapping layers (31) and (35) differ so that their blocking temperatures (the temperature at which the exchange coupling with the adjacent ferromagnetic layer or, as applicable, the storage layer (30) and the reference layer (34) are properly differentiated. More specifically, the blocking temperature of layer (31) must be lower than that of layer (35) in order to allow, during writing, for release of the magnetization of the storage layer (30) for writing, without impairing the direction of magnetization of the reference layer (34) of the same memory point.

It is advantageous for the reference layer (34) to be a synthetic structure comprised of one anti-ferromagnetic synthetic layer and two ferromagnetic layers of nickel-, cobalt- and iron-based alloys, separated by a non-magnetic layer, in such a manner that the magnetizations of the two ferromagnetic layers are coupled with anti-parallel orientations of their magnetizations in order to minimize the magneto-static field acting on the storage layer (30).

The reference storage layers may, in addition, advantageously comprise, near the interface with the tunnel barrier, an additional layer of cobalt or a cobalt-rich alloy intended to increase the polarization of the tunnel electrons and therefore the amplitude of magnetoresistance.

Figure 4A:
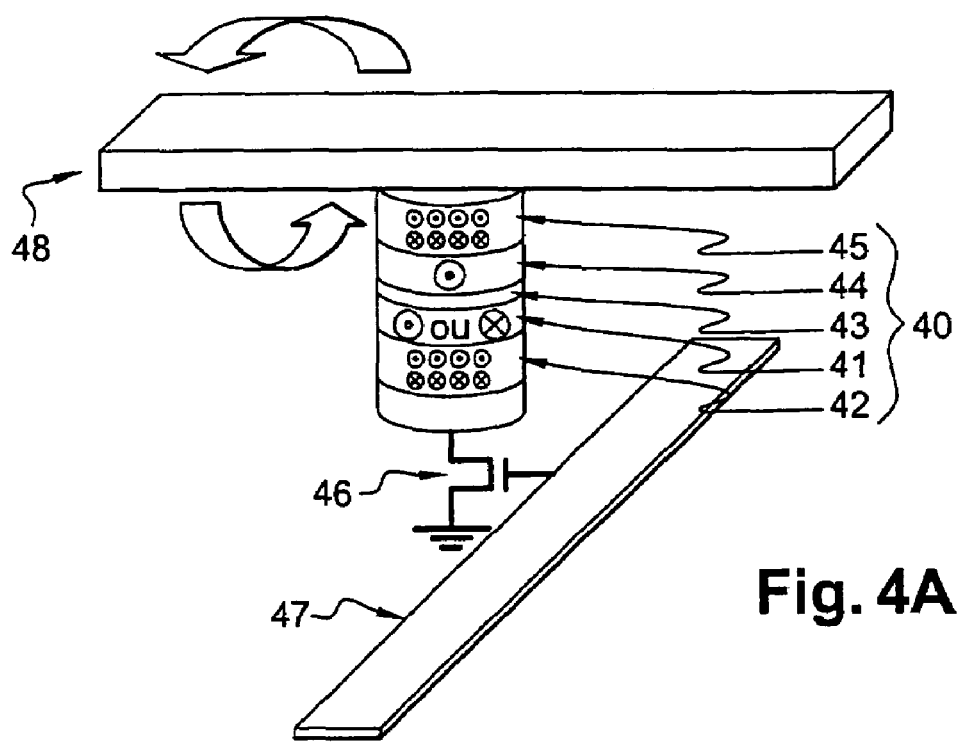
Figure 4B:
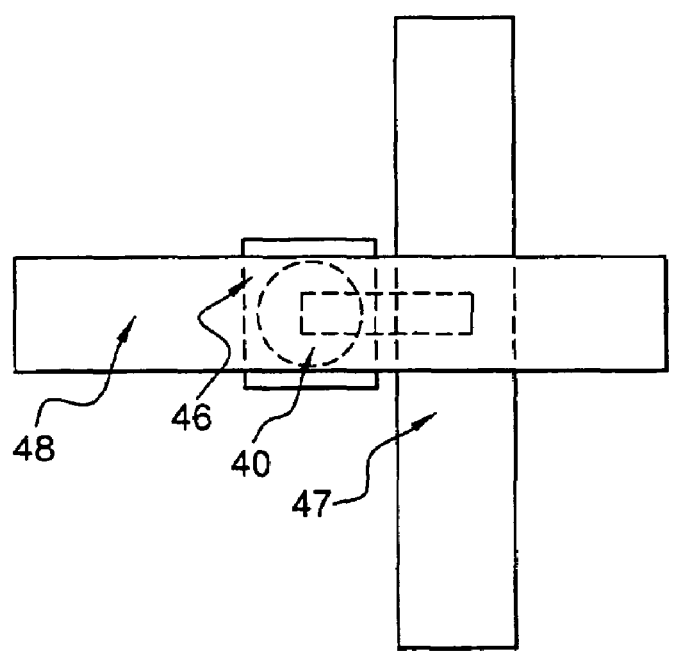
FIG. 4B is a schematic top view.

FIGS. 4A and 4B are schematic diagrams of the structure of a memory point in accordance with the invention. The memory point comprises the magnetic tunnel junction proper, which is cylindrically shaped, as has already been stated, an addressing transistor (46) equipped with its control line (47) and a conductor (48), allowing the magnetic field parallel to the easy axis of magnetization of the storage layer (41) to be generated. Magnetization of the magnetic layers is essentially in the plane of the layers.

As explained above, this structure with a single tunnel barrier could advantageously be replaced with a double tunnel barrier structure. In this case the storage layer (41) is comprised of an anti-ferromagnetic triple layer (for example $Ir_{20}Mn_{80}$) sandwiched between two simple or complex ferromagnetic layers, (for example, $Ni_{80}Fe_{20}/Co_{90}Fe_{10}$). This storage "triple layer" is inserted between two tunnel barriers, on the opposite side of which are located the two reference layers similar to those described in the prior art.

The operation of these structures can be described as follows:

The blocking temperatures of the storage and reference layers must be higher than the operating temperature of the memory excluding heating, and even markedly higher than this operating temperature as soon as it is desired to store the information stably. The blocking temperature of the storage layer must be lower than that of the reference layer.

Thus in the writing phase the transistor (46) associated with the memory point (40) is switched in blocked mode by a voltage pulse in line (47). At the same time a voltage pulse is applied to the memory point (40) through the line (48), in such a manner that an electric current passes through the tunnel junction (40) via the transistor (46). The voltage level is defined in such a manner that the power density produced in respect of the junction allows the temperature of the tunnel junction (40) to be raised to a temperature higher than the blocking temperature of the anti-ferromagnetic layer (42) and lower than the blocking temperature of the trapping layer (45). At this temperature, the magnetization of the storage layer (41) is no longer trapped by the layer (42) and can therefore be reversed under the effect of a writing magnetic field. On the other hand, the magnetization of the reference layer (44), consisting of a material having high magneto-crystalline anisotropy, and separated from the storage layer (41) by the insulating barrier (43), remains trapped by the layer (45), the blocking temperature of which is higher than that of the layer (42), such that it does not switch under the effect of the writing magnetic field.

It should be noted that when considering a maximum current density of 10 mA/μm$^2$ in order to limit the size of the control transistor (46), and a product R×A (resistance×surface area) of the tunnel junction (40) of 100 and 200 Ohms/μm$^2$ (values accessible in the prior art) for single- and double-barrier junctions respectively, the voltages to be applied are of the order of 1 to 2 volts. These values are perfectly admissible in a dynamic regime (electric pulses of short duration).

Once the memory point has been heated to above the blocking temperature of the anti-ferromagnetic layer (42), heating is stopped by closing the transistor (46) so as to switch off the heating current passing through the tunnel junction (40). The current pulse in the excitation conductor (48), which is no longer passing through the tunnel junction (40), is maintained with a sign and an amplitude such that the magnetic field produced allows the magnetization of the storage layer (41) to be reversed in the desired direction. The synchronization and duration of the pulse must be adjusted in such a manner that the magnetization of the storage layer (41) is oriented in the desired direction during cooling of the memory point (40) until a temperature of the memory point that is lower than the blocking temperature of the anti-ferromagnetic layer (42). It is then possible to switch off the current in the line (48). The memory point (40) then finishes coming down again to the non-writing operating temperature and the magnetization of the storage layer (41) finishes being fixed in the desired direction. The memory point is then written.

In order to understand better the benefit inherent in the implementation of a cylindrical memory point, as described in the present invention, it is appropriate to express the energy of the potential barrier height that has to be crossed to move from a state "0" to a state "1" of the memory point, said potential barrier height being linked, on the one hand, to the value of the magnetic field that has to be applied to write the memory point, and therefore to the power consumption, and on the other hand, to the thermal and temporal stability of the data written.

In the case of the prior art where the storage layer is not trapped by exchange interaction at the trapping layer (42), the thermal stability of the memory is ensured by the form anisotropy of the memory point, which anisotropy is directly linked to the aspect ratio between length and width of the memory point. The energy of the barrier per volume unit is then written as:

$$E_b = K + \frac{AR - 1}{L} t M_s^2$$

where the first term (K) is magneto-crystalline anisotropy and the second term is form anisotropy. In this second term AR is the aspect ratio (length/width) of the memory point, L is its width, t the thickness of the storage layer (41) and Ms its saturation magnetization. For a value of AR=1.5 (a typical value in the prior art), Eb is written:

$$E_b = K + \frac{0.5}{L} t M_s^2$$

The limits of the prior art can immediately be detected. Indeed:

the more the memory point decreases in size (L decreases, AR is constant), the more the barrier energy increases, hence a significant increase in power consumption;

the weaker the aspect ratio (AR decreases, L is constant), the more the barrier energy decreases, hence a loss of thermal and temporal data stability, which increases as the memory point decreases in size. The only remedy here is to increase the magneto-crystalline anisotropy K by adapting the material of the memory point, but then at the expense of a significant increase in power consumption.

In the case of the present invention, in which the storage layer (41) is trapped by an exchange with the layer (42), it is no longer necessary to use form anisotropy to ensure the thermal and temporal stability of the memory point. By choosing a circular or almost circular geometry (AR~1), the term form anisotropy is cancelled, and the barrier energy is then written:

$$E_b = K + \frac{J_{ex} - M_s^2}{t} \left\{ 1 - \frac{T}{T_B} \right\}$$

where the second term now corresponds to the exchange energy between the storage layer (41) and the trapping layer (42). The advantage of the invention over the prior art then becomes clear. This is because:

at rest, the barrier energy is adapted by the choice of the materials (42) (through the exchange constant $J_{ex}$) and (41) (through the thickness t and magnetization Ms) to be sufficient to permit thermal and temporal stability;

during writing, the current passing through the memory point causes an increase in temperature up to or above the blocking temperature $T_B$ of the layer (42), so that the storage layer (41) is untrapped. In other words the second term of the above equation is cancelled and the barrier energy becomes simply $E_b$=K, the smallest possible value for a magnetic memory point. By advantageously choosing the material of the storage layer (41), it is possible to sufficiently lower the barrier (K=0) to minimize the magnetic field required during the writing process and therefore power consumption.

The benefit of the present invention becomes clear in the light of this description, since it makes it possible to optimize separately the storage function (thermal and temporal stability) and the writing function (minimization of power consumption). It is a major improvement over the prior art, in which the two functions are mixed, therefore requiring difficult trade-offs.

One observes therefore that, according to the present invention, there is only one line of generation of a writing magnetic field, contrary to the prior art devices. The single line thus makes it possible to superimpose the control transistor (46) and its corresponding control line (47) with the memory point (40), which results in a minimization of the dimension of the elementary memory cell, thereby increasing the integration possibilities. Furthermore the square network of memory points has a much simpler structure since the memory is formed of single lines of memory points, which further rationalizes the production processes.

The conductive line used to generate the heating pulse may advantageously be separate from the conductive line used to generate the magnetic field pulse, in order to optimize the respective current densities for the two operations.

Figure 6A:
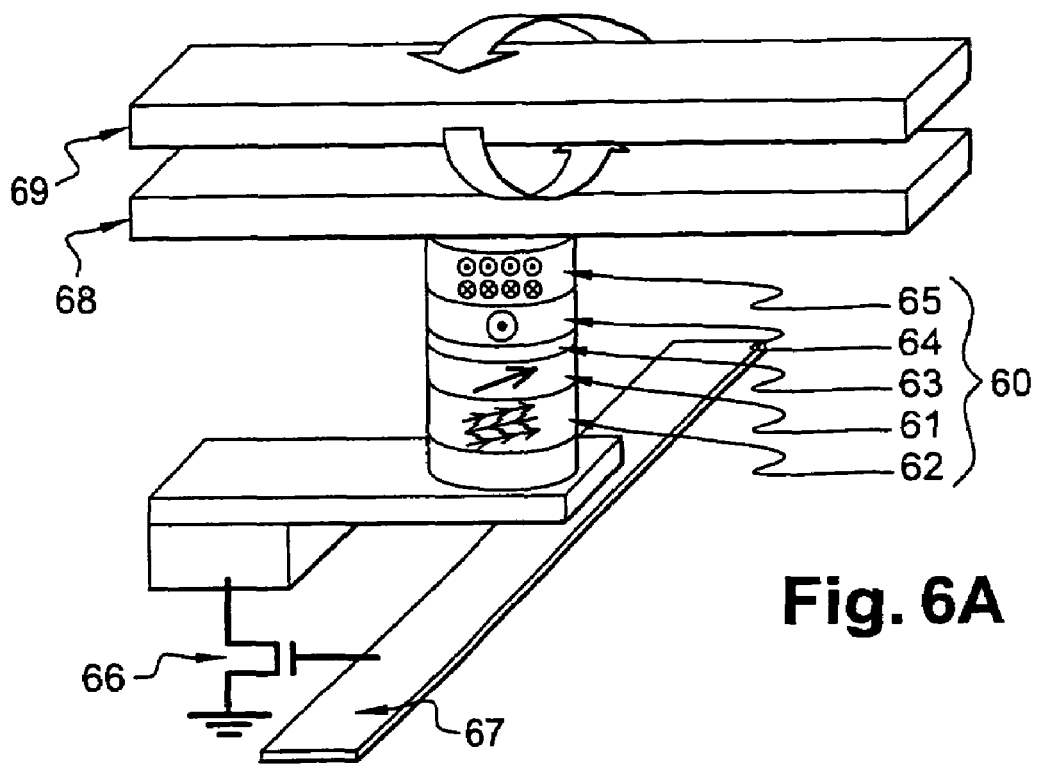

As can be observed from FIG. 6A, this additional current line (69) which is implemented to generate the magnetic field pulse and is electrically insulated from the memory point (60) and the conductor (67), is advantageously placed above the memory point (60) such as to allow the control transistor (66) to be superimposed over its control line (67) with the memory point (60), thus preserving the compactness of the memory.

The current pulses in the lines (68) and (69) can be controlled independently, from both the point of view of current amplitude and from that of current pulse duration and of their synchronization.

Figure 5A:
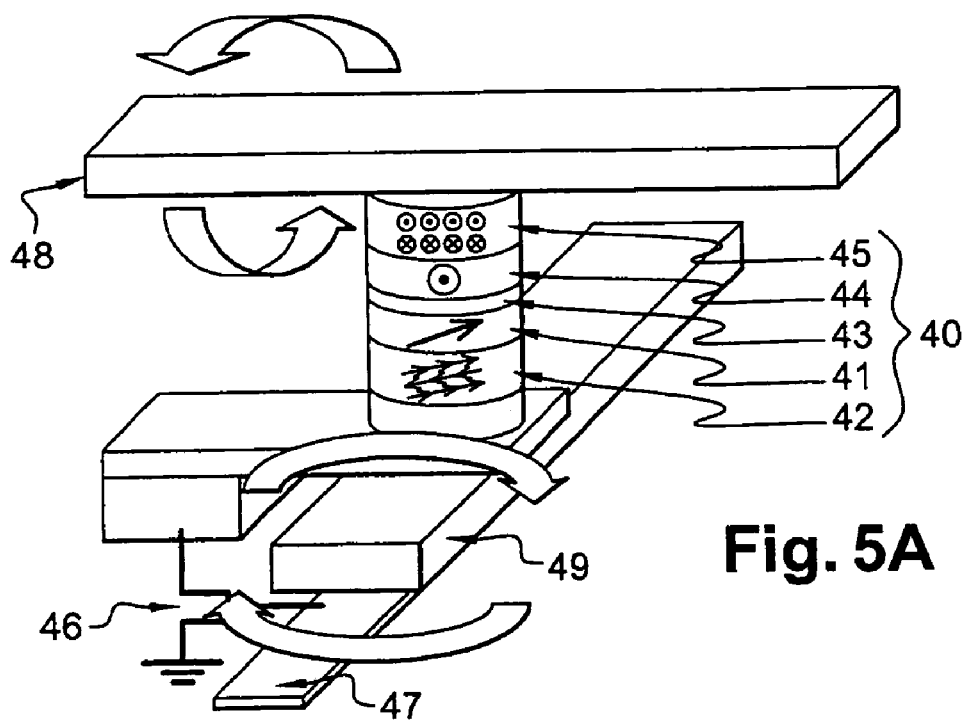

Furthermore by using a storage layer trapped by an antiferromagnetic layer, this writing technique allows more than two magnetic states to be created in the memory point (40). To do so, it is necessary to have not a single conductor line to generate the writing field, but two perpendicular lines, as shown in FIG. 5A, the lines (48) and (49). The combination of these two perpendicular fields makes it possible to create any direction of magnetic field in the plane of the sample. By applying this field in the desired direction during cooling of the storage layer by means of its blocking temperature, it is thus possible to stabilize other intermediate magnetic configurations between parallel and anti-parallel alignment, corresponding to intermediate resistance levels. In this way it is possible to simultaneously obtain several magnetic states in the memory point, and thus a so-called "multi-level" storage, while retaining the advantage afforded by the invention of very low power consumption.

According to an alternative embodiment of the invention, it is possible to make the magnetization of the storage layer switch during cooling of the memory point by using the phenomenon of magnetic switching by injection of spin polarized current. The physical origin of this phenomenon has been described by J. SLONCZEWSKI, *Journal of Magnetism and Magnetic Materials* vol. 159 (1996), page L1 and by L. BERGER, *Physical Review* vol. B54 (1996), page 9353.

This principle consists of passing a tunnel current through the junction. If the electrons pass by a tunnel effect from the reference layer towards the storage layer, that is, if the current flows from the storage layer towards the reference layer, the magnetization of the storage layer will be oriented parallel to the direction of the injected spins provided that the current is intense enough, which again presupposes that the barrier has a low electrical resistance. If, on the contrary, the electrons pass by a tunnel effect from the storage layer towards the reference layer, the magnetization of the storage layer will be oriented anti-parallel to the magnetization of the reference layer.

Figure 5B:
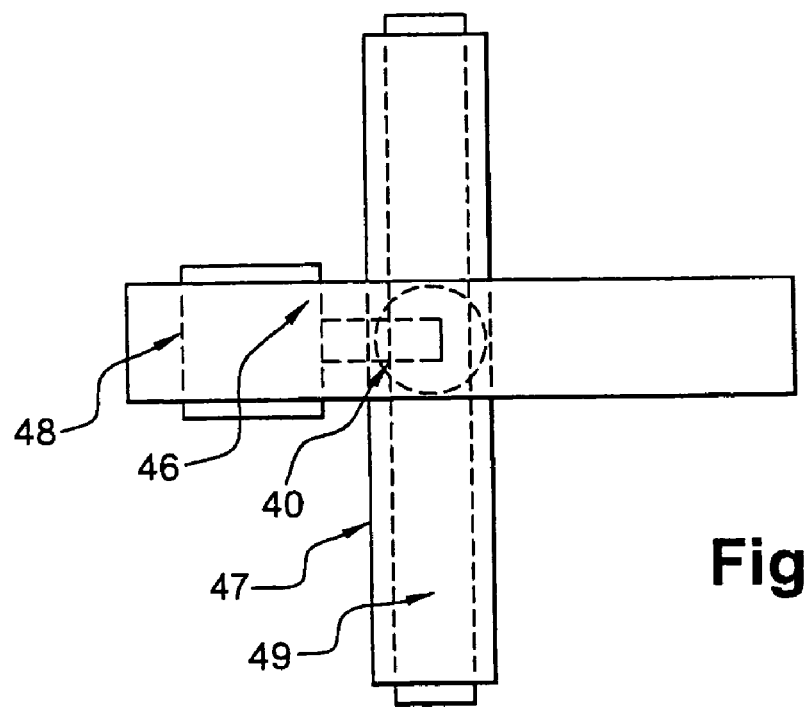
FIG. 5B is a schematic top view.
Figure 6B:
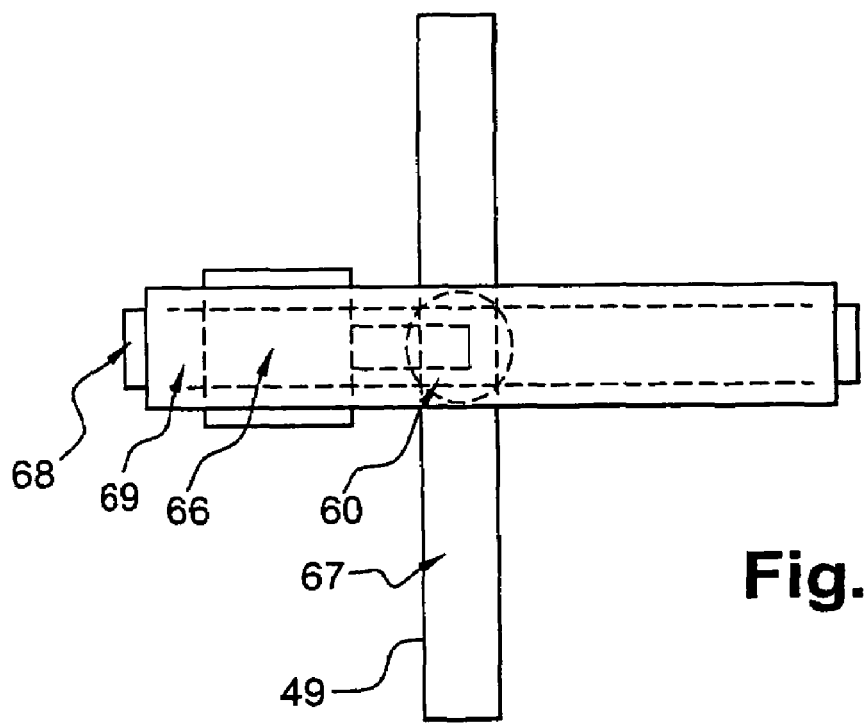
FIG. 6B is a schematic top view.

Whatever the mode of magnetic switching that is employed, the reading process is identical to that described in the prior art. A reading is carried out of the resistance of the memory point (40) by a weak-amplitude current controlled by the opening of the control transistor (46). The resistance is generally compared with that of a reference cell not shown in FIGS. 4 to 6.

The full benefit of this architecture can be understood to the extent that:

since the magnetization of the storage layer is no longer trapped by the-anti-ferromagnetic layer (42) during the writing process, the reversal field of the storage layer

(41) may be extremely low since it is now defined only by intrinsic properties of said storage layer (41);

owing to the use of a material having very weak magnetic anisotropy (magnetically very soft) for said storage layer (41), on the one hand, and the cylindrical geometry of the memory point (40) (lack of a demagnetizing field) on the other hand, leading to very low magnetic anisotropy, the reversal of the storage layer (41) can therefore be carried out in a very weak magnetic field;

the thermal and temporal stability of the data written in the memory point is excellent owing to the coupling between the storage layer (41) and the trapping layer (42);

owing to the circular geometry of the memory point, the influence of variations in size on the value of the reversal field of the individual memory points is eliminated. Consequently addressing errors made during the writing process are greatly reduced and the manufacturing processes simplified.

It results from these considerations that it is possible to lower the writing current of the selected memory point (40) to values well below those required by the prior-art devices without burdening the thermal and temporal stability of the data written.

This reduction of power consumption increases as the dimensions of the memory point are reduced. Whereas the prior art leads to power consumptions during writing that increase as the size of the memory points is reduced, the present invention, on the contrary, allows for power consumption to be reduced when the size of the memory point is reduced. In other words, the competitive advantage of the present invention will only increase as the size of the memory points decreases.

Furthermore writing selectivity is conserved since the other memory points situated on the same line or the same column are not heated during the writing process, the corresponding storage layers (41) of said unselected memory points remain coupled to the corresponding anti-ferromagnetic layers (42) since they are insensitive to the magnetic field applied.

Moreover, multi-level storage is facilitated since the magneto-static energy is the same in all spatial directions. Consequently, the writing field is identical whatever the direction given to magnetization in relation to the reference direction. It should also be pointed out that by means of this architecture heating can be obtained by an external heating element not shown in FIGS. 4 and 5. This heating element may be a layer of high electrical resistivity located above or beneath the layers (42) or (45) respectively.

According to an advantageous feature of the invention, the reference layer (44) is of a synthetic anti-ferromagnetic type in order to improve writing discrimination by reducing the magneto-static field.

According to an advantageous feature, the storage layer of the memory point may be comprised of one or more ferromagnetic layers of the ferrimagnetic amorphous alloy type (FAA). In this case the temperature attained during the writing process is no longer a blocking temperature of the anti-ferromagnetic layer (42) but the Curie temperature of the trapping layer (42) made of FAA. Such layers of FAA are specifically alloys of cobalt and rare earth, such as samarium (Sm) terbium (Th) or again, without this limiting the scope of the invention, gadolinium (Gd).

Furthermore the addressing technique in accordance with the invention allows simultaneous writing of several memory points by selecting simultaneous heating of several memory points. This approach makes it possible to increase the overall writing speed of the memory.

The invention claimed is:

1. Magnetic memory written in a thermally assisted manner, each memory point of which (40, 60) is formed by a magnetic tunnel junction, and the cross-section of which parallel to the plane of the layers forming the tunnel junction is circular or substantially circular, said tunnel junction comprising at least:

a reference magnetic layer (44, 64) termed "trapped layer", the magnetization of which is in a fixed direction;

a storage magnetic layer (42, 62), termed a "free layer", the direction of magnetization of which is variable;

an insulating layer (43, 63), placed between the free layer (42, 62) and the trapped layer (44, 64), in which the storage layer (42, 62) is formed of at least one soft magnetic layer, that is, having reduced magnetic anisotropy, and a trapping layer (41, 61), the two layers being magnetically coupled by contact, and in which the operating temperature of the memory when reading or at rest is selected at below the blocking temperature of the free and trapped layers respectively.

2. Magnetic memory as claimed in claim 1, characterized in that the magnetic anisotropy of the soft magnetic layer is lower than 10 Oersted, and preferably in a range between 1 and 3 Oersted.

3. Magnetic memory according to claim 1, characterized in that the soft magnetic layer of the storage layer (42, 62) is formed by a nickel-, cobalt- and iron-based alloy.

4. Magnetic memory according to claim 1, characterized in that the trapping layer (41, 61) is formed by a material chosen from the group comprising the iron- and cobalt-based alloys, the manganese-based anti-ferromagnetic alloys and the amorphous rare earth- and transition metal-based alloys.

5. Magnetic memory according to claim 1, characterized in that the reference layer or trapped layer (44, 64) is formed by an artificial anti-ferromagnetic synthetic layer comprised of two ferromagnetic layers separated by a non-magnetic layer, in such a manner that the magnetizations of the two ferromagnetic layers are anti-parallel.

6. Magnetic memory as claimed in claim 5 characterized in that the reference layer or trapped layer (44, 64) is formed by a material having high magneto-crystalline anisotropy.

7. Magnetic memory according to claim 1, characterized in that the memory points (40, 60) are organized as a network, each memory point being connected at its peak to a conductive line (48, 68, 69) intended to generate a reversal magnetic field and to induce heating of said memory point, and at its base to a selection transistor (46, 66), with writing being carried out in respect of a memory point in question in two stages:

simultaneously sending electric current pulses to said conductive line (48, 68, 69) and a current opening said transistor (46, 66);

sending a transistor (46, 66) closing command so that the current passing through the line (48, 68, 69) no longer passes into the memory point (40, 60) but serves to produce the writing magnetic field during cooling of said memory point.

8. Magnetic memory as claimed in claim 7, characterized in that the control transistor (46, 66) and its corresponding control line (47, 67) are placed under the memory point in question.

9. Magnetic memory as claimed in claim 7, characterized in that the conductive line (68) performs a double function as a conductor (68) dedicated to heating the memory point (60)

and as a conductor (69) independent of conductor (68) and electrically insulated from the latter, being dedicated to production of the reversal field.

10. Magnetic memory as claimed in claim 9, characterized in that the current pulses to lines (68) and (69) are independently controlled.

11. Magnetic memory as claimed in claim 10, characterized in that the current pulses to lines (68) and (69) are coincident.

12. Magnetic memory as claimed in claim 9, characterized in that the additional conductor (69) is superimposed on the heating conductor (68).

13. Magnetic memory as claimed in claim 9, characterized in that the memory point (60), the control transistor (66) and the conductors (68, 69) are superimposed.

14. Random access magnetic memory, characterized in that it is made in accordance with claim 1.

15. Process for writing in a magnetic memory written in a thermally assisted manner and formed by a network of memory points each of which is formed by a magnetic tunnel junction (40, 60), and the cross-section of which parallel to the plane of the layers forming the tunnel junction is circular or substantially circular, said tunnel junction comprising at least:

a reference magnetic layer (44, 64) termed "trapped layer", the magnetization of which is in a fixed direction;

a storage magnetic layer (42, 62), termed a "free layer", the direction of magnetization of which is variable;

an insulating layer (43, 63), placed between the free layer (42, 62) and the trapped layer (44, 64), and in which the operating temperature of the memory when reading or at rest is selected at below the blocking temperature of the free and trapped layers respectively, consisting:

first, of sending an electric pulse by means of a conductor (48, 68) into the memory point to be written, the purpose being to induce heating of said memory point until a temperature is reached that is greater than the blocking temperature of the storage layer (42, 62) but lower than the blocking temperature of the reference layer (44, 64);

then, during the cooling of said memory point that occurs after this heating, of sending an electric pulse by means of the conductor (48, 68) or of an additional conductor (69) which is independent and electrically insulated from the conductor (68), the purpose being to generate a reversal magnetic field capable of modifying the magnetization of the storage layer (42, 62).

16. Process for writing in a magnetic memory formed by a network of memory points each of which is formed by a magnetic tunnel junction (40, 60) as claimed in claim 15, characterized in that a plurality of memory points are written simultaneously by selecting said memory points to be written by heating of the memory points in question.

* * * * *